United States Patent
Feng et al.

(10) Patent No.: US 7,928,544 B2
(45) Date of Patent: Apr. 19, 2011

(54) SEMICONDUCTOR CHIP PACKAGE ASSEMBLY WITH DEFLECTION-RESISTANT LEADFINGERS

(75) Inventors: Chien-Te Feng, Shindian (TW); Yuan-Pao Cheng, Jhongli (TW); Li-Chaio Chou, Taipei (TW)

(73) Assignee: Texas Instruments Incorporated, Dallas, TX (US)

( * ) Notice: Subject to any disclaimer, the term of this patent is extended or adjusted under 35 U.S.C. 154(b) by 338 days.

(21) Appl. No.: 12/120,515

(22) Filed: May 14, 2008

(65) Prior Publication Data

US 2009/0283880 A1 Nov. 19, 2009

(51) Int. Cl.
*H01L 23/495* (2006.01)
(52) U.S. Cl. ........ 257/675; 257/666; 257/670; 227/675; 227/684
(58) Field of Classification Search .................. 257/666, 257/670, 675, 706, E23.043, E23.101; 227/675, 227/676, 684, 796
See application file for complete search history.

(56) References Cited

U.S. PATENT DOCUMENTS

| 6,188,130 | B1 * | 2/2001 | Ramirez et al. | 257/706 |
| 6,841,857 | B2 * | 1/2005 | Beer et al. | 257/675 |
| 2003/0160322 | A1 * | 8/2003 | Hsieh et al. | 257/728 |
| 2009/0243057 | A1 * | 10/2009 | Feng et al. | 257/670 |

* cited by examiner

*Primary Examiner* — Phuc T Dang
(74) *Attorney, Agent, or Firm* — Wade James Brady, III; Frederick J. Telecky, Jr.

(57) ABSTRACT

The invention relates to leadframes and semiconductor chip package assemblies using leadframes, and to methods for their assembly. A disclosed embodiment of the invention includes a semiconductor package leadframe with a chip mounting surface for receiving a semiconductor chip and a plurality of leadfingers. The leadfingers have a proximal end for receiving one or more wirebond, and a distal end for providing an electrical path from the proximal end. One or more of the leadfingers also has an offset portion at its proximal end for increasing the clearance between the leadfinger and underlying heat spreader, increasing the stiffness of the leadfinger, and increasing leadfinger deflection-resistance and spring-back. The offset is in the direction opposite the plane of a heat spreader thermally coupled to the mounting surface. Preferred embodiments of the invention further include a semiconductor chip affixed to the mounting surface and a plurality of bondwires operably coupling bond pads of the chip to the offset portions of the proximal ends of individual leadfingers.

8 Claims, 3 Drawing Sheets

SEMICONDUCTOR CHIP PACKAGE ASSEMBLY WITH DEFLECTION-RESISTANT LEADFINGERS

TECHNICAL FIELD

The invention relates to electronic semiconductor chip package assemblies and manufacturing. More particularly, the invention relates to package assemblies and associated methods for manufacturing semiconductor chip package assemblies with improved leadframes and improved processes for wirebonding leads to leadframes.

BACKGROUND OF THE INVENTION

In leaded semiconductor chip packages, a chip is generally affixed to a paddle on a leadframe using a permanent adhesive. In some cases, it is desirable to enhance the thermal performance of a package by improving the path for the departure of heat from the chip through the leadframe. In many such cases, it is known to attach a heat spreader to the surface of the paddle opposite the chip, such as by welding, taping, or gluing. In other cases, the leadframe paddle is dispensed with, using instead a heat spreader riveted in place on the leadframe. The chip is then mounted directly to the heat spreader surface. In either case, due to its heat conduction properties, the heat spreader is typically made from metal, such as copper or copper alloy. Generally, in order to increase its heat conduction, the heat spreader is large relative to the chip, extending in a plane parallel with the proximal ends of the leadfingers. The leadframe is typically planar, with leadfingers extending in a straight path from the edges toward the chip location. This type of arrangement of chip, leadfingers, and heat spreader at least partially underlying the leadfingers, is used in many applications, but is not without its problems.

Electrical connections within a semiconductor chip package are commonly made by bonding wires from bond pads on the exposed surface of the chip to the leadfingers. The leadfingers typically extend in a straight line from one end adjacent to a gap in the leadframe proximal to the chip, to a distal end at the exterior of the package where electrical connections may be made to the outside world. During a typical wirebonding process, a ball bond is formed on a bond pad of the chip using heat, pressure, and in many cases ultrasonic vibrations. The wire is then pulled to the appropriate proximal end of a leadfinger, and a stitch bond is formed there, also using some combination of heat and pressure, and often ultrasonic vibrations.

In package assemblies having a heat spreader extending parallel to the proximal ends of the leadfingers, it is often impractical to support the leadfingers during wirebonding. In some applications, where support to leadfingers during wirebonding is deficient, it is known to provide increased clearance between the leadfingers and the underlying heat spreader by increasing the distance between them, or by downsetting the chip pad away from the plane of the leadfingers. The result in such cases is thicker package assemblies, which in most applications is undesirable. On the other hand, minimizing thickness by reducing such clearance can result in electrical problems and defective package assemblies.

Due to these and other technological problems, improved leadfingers, leadframes, semiconductor chip package assemblies, and methods for their manufacture would provide useful and advantageous contributions to the art. The present invention is directed to overcoming, or at least reducing, problems present in the prior art, and contributes one or more heretofore unforeseen advantages indicated herein.

SUMMARY OF THE INVENTION

In carrying out the principles of the present invention, in accordance with preferred embodiments thereof, the invention provides novel and useful improvements for leadframes used in semiconductor chip package assemblies, and related methods. Experience, observation, analysis, and careful study of defects in semiconductor device packages related to clearance issues have led the Applicants to determine that particular problems are encountered in applications having leadfingers extending in a plane parallel to a heat spreader. Typically, the proximal end of the leadfinger, which is suspended parallel to the heat spreader and lacks lateral support, is deflected "downward", e.g., in the direction opposite the wirebond, by the application of pressure from the wirebonding tool. In some cases, the deflected leadfinger comes into contact with the underlying heat spreader during wirebonding. Due to the mechanical properties of the leadframe material, however, which is typically made from metal such as aluminum, copper, or alloy, the leadfinger has some capacity to spring back toward its original shape after the pressure of the bonding tool is removed. The return of the proximal end of the leadfinger toward its original position is often not complete, however. In some, more problematic, applications, multiple wirebonds may be formed from a chip to a single leadfinger. It has been observed that in such cases, the effects of repeated deflection of the leadfinger may be cumulative, with the result that the proximal end of the leadfinger becomes permanently deformed by the wirebonding process. When the geometry of the package includes a heat spreader extending in a plane parallel to the proximal ends of the leadfingers, the proximal ends of the leadfingers, particularly those bearing multiple bondwires, can in some cases be left in contact with, or nearly in contact with, the heat spreader due to deformation caused by the pressures applied during wirebonding. In such cases, undesirable interference, capacitance, or even short circuits may result. In order to circumvent this problem, the Applicants have contrived to configure the leadfingers offset from the plane of the leadframe in a novel way in order to increase clearance between leadfingers and heat spreaders without increasing overall package thickness. Such endeavors have further led to the development of leadfinger configurations that not only increase clearance between leadfingers and heat spreaders, but also increase the mechanical stiffness and spring force of the leadfingers. Synergistically, the invention provides leadfinger configurations that increase clearance within a given package thickness, while providing improved stiffness and "spring-back". Mechanically speaking, stiffness is a property of a solid body dependent on both the properties of the material, such as elastic modulus, and the shape of the solid body. For a solid body in compression, the axial stiffness may be expressed as, the product of the cross-sectional area and the modulus of elasticity (aka, Young's modulus) of the material, divided by the length of the body. The spring force exerted by the body is defined by the product of the stiffness and the distance it may be moved. In the case of the invention, it is believed that the stiffness and springiness of the leadfingers may be increased by offsetting a portion of the leadfingers.

For the purposes of avoiding confusion and unnecessary repetition in fully describing the invention, the term "mounting surface" is used herein to refer to the surface upon which a chip may be mounted, which includes a chip paddle integral with the leadframe, or a portion of a heat spreader adapted to receive the mounting of a chip directly on a portion of its surface.

According to one aspect of the invention, in an example of a preferred embodiment, a semiconductor chip package leadframe has a mounting surface adapted for receiving a semiconductor chip, and a number of leadfingers. Each of the leadfingers has a proximal end for receiving one or more wirebond and a distal end for providing an electrical path from the proximal end. At least some of the leadfingers also have an offset portion at the proximal end, the offset being in the direction opposite the plane of the mounting surface.

According to another aspect of the invention, a semiconductor chip package assembly includes a metallic leadframe with a mounting surface for receiving a semiconductor chip. A heat spreader is thermally coupled with the mounting surface. A semiconductor chip with numerous bond pads on its exposed surface is affixed to the mounting surface. The leadframe also includes a plurality of leadfingers, each having a proximal end for receiving one or more wirebond, and a distal end for facilitating electrical connections external to the package. A number of the leadfingers also have an offset portion at the proximal end, in the direction opposite the plane of the heat spreader. Bondwires operably couple bond pads of the semiconductor chip to the offset portions of the proximal ends of individual leadfingers. The assembly, i.e., chip, bondwires, heat spreader, and the offset portions of the leadfingers, is substantially encapsulated in dielectric material.

According to another aspect of the invention, the semiconductor chip package assembly as mentioned above, and described elsewhere herein, includes at least one leadfinger offset portion which has a plurality of bondwires attached.

According to still another aspect of the invention, a method for assembling a semiconductor chip package includes the step of providing a metallic leadframe having a mounting surface for receiving a semiconductor chip. A heat spreader is thermally coupled to the mounting surface. The leadframe also has numerous leadfingers, each with a proximal end for receiving one or more wirebond, and a distal end for receiving electrical connections external to the package. One or more of the leadfingers includes an offset portion at its proximal end, the offset being in the direction opposite the plane of the heat spreader. In further steps, a semiconductor chip is affixed to the mounting surface, and bondwires are operably coupled between bond pads of the semiconductor chip and offset portions of the proximal ends of the leadfingers. Encapsulating the assembly is a further step in completing the package.

According to yet another aspect of the invention, the method described further includes operably coupling more than one bondwire to a single leadfinger offset portion.

The invention has advantages including but not limited to one or more of the following: decreased thickness in package structures; increased yield and reliability in manufacturing processes; improved thermal performance in packages; and reduced cost. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

The drawings are not to scale, and some features of embodiments shown and discussed are simplified or amplified for illustrating principles and features, as well as anticipated and unanticipated advantages of the invention.

DESCRIPTION OF PREFERRED EMBODIMENTS

While the making and using of various exemplary embodiments of the invention are discussed herein, it should be appreciated that the present invention provides inventive concepts which can be embodied in a wide variety of specific contexts. It should be understood that the invention may be practiced with semiconductor package assemblies and associated manufacturing processes of various types and materials without altering the principles of the invention. For purposes of clarity, detailed descriptions of functions and systems familiar to those skilled in the semiconductor chip, packaging, and manufacturing arts are not included.

In general, the invention provides semiconductor chip assemblies, and associated methods, using leadframes having leadfinger offsets to particular advantage, especially in applications wherein leadfinger deflection during wirebonding may be a concern. Features of the invention are advantageous in terms of reduced defects in completed package assemblies, increased mechanical strength and durability, improved thermal performance, decreased assembly thickness, and improved electrical performance.

Figure 1:
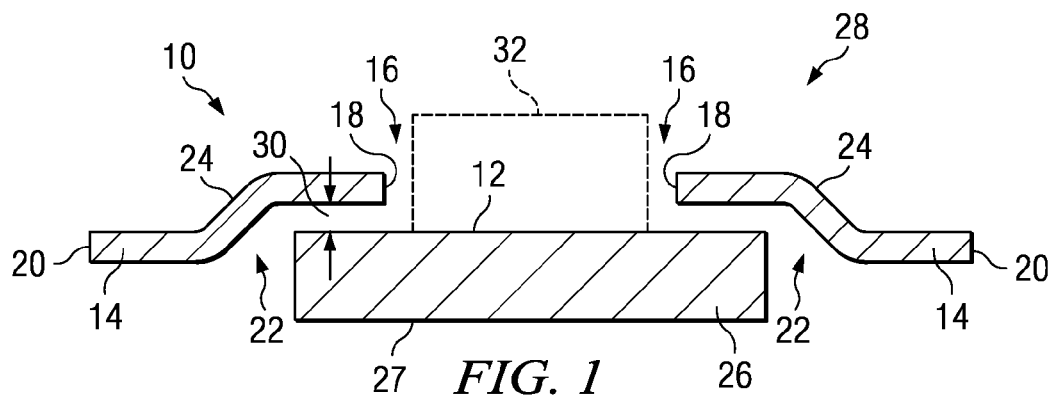
FIG. 1 is a cutaway side view of an example of a preferred embodiment of a semiconductor package leadframe according to the invention.

Referring initially to FIG. 1, a cutaway side view of an example of a leadframe assembly 28 of the invention for use in a semiconductor chip package assembly is illustrated. The leadframe 10 is made from metal such as aluminum or copper as known in the art, and has a mounting surface 12, in this exemplary embodiment, the surface 12 of a heat spreader 26 riveted in place on the leadframe 10, for receiving a semiconductor chip 32. Thus, a thermal path is provided from the chip 32 to the bottom surface 27 of the heat spreader 26. The leadframe 10 also has a number of leadfingers 14 preferably extending from a gap 16 at the ends 18 proximal to the mounting surface 12, adjacent to the eventual chip 32 location, outward to where they may ultimately be used as external package leads at their distal ends 20. The leadfingers 14 preferably each include an offset portion 22, which includes the proximal end 18, which is connected to the distal end 20 by an offsetting portion 24, typically angled away from the plane of the distal end 20. Clearance 30 is thus established between the offset portions 22 of the leadfingers 14 and the heat spreader 26. It is believed that when an offset portion 22 is included on the leadfingers 14, the proximal ends 18 of the leadfingers 20 are more resistant to deflection by wirebonding tools during wirebonding, and more resiliently spring back toward their original positions after such deflecting forces are abated. It is believed that the offset portion 22 of the leadfinger 14 increases the not only the clearance 30 between the leadfinger 14 and the heat spreader 26, but also increases the mechanical stiffness of the leadfinger 14, and that the combined stiffness and clearance 30 further increase the spring force of the leadfinger 14 in resistance to compression during wirebonding.

Figure 2:
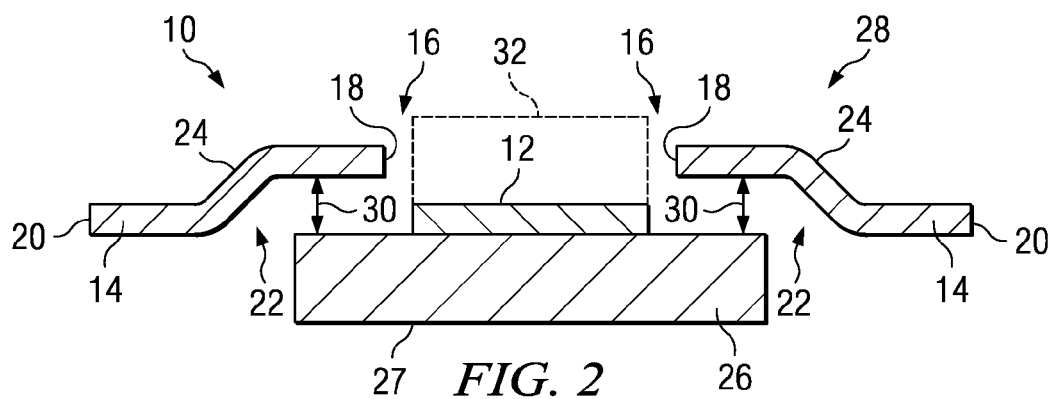
FIG. 2 is a cutaway side view of an example of an alternative preferred embodiment of a semiconductor package leadframe according to the invention.

The offset portion 22 of a leadfinger 14 according to the practice of the invention is offset in the direction most beneficial to electrical and thermal performance. Now referring primarily to FIG. 2, a cutaway side view of a semiconductor package leadframe 10 according to the invention is shown in a preferred embodiment in which the mounting surface 12 is a paddle portion integral with the rest of the leadframe 14. A heat spreader 26 is attached to the chip paddle mounting surface 12 forming a direct thermal path from the mounting surface 12. The leadframe assembly 28 thus includes leadfingers 14 each having an offset portion 22 at their proximal ends 18, adjacent to the gap 16 separating the leadfinger 14 from the ultimate chip 32 location on the mounting surface 12 to the opposite surface 27 of the heat spreader 26. The offset portion 22 is offset by an angle or bend 24 in the direction opposite the plane of the surface of the heat spreader 26. The amount of offset may be adjusted for individual applications based upon factors such as the cross-sectional area of the leadfinger, the thickness of the bondwire to be used, the number of bondwires to be attached, and the inherent stiffness of the leadframe material. Preferably, the gap 16 between the proximal end 18 of the leadfinger 14 and the chip 32 location on the mounting surface 12 is as small as electrically practical, as it is generally advantageous to minimize the length of the bondwires ultimately used in the package. The enhanced resilience of the leadfinger 14 due to the offset portion 22, and the clearance 30 provided between the heat spreader 26 and the offset portion 22 of the leadframe 14, and in some cases the reduced gap 16, provide practical advantages described herein.

Figure 3:
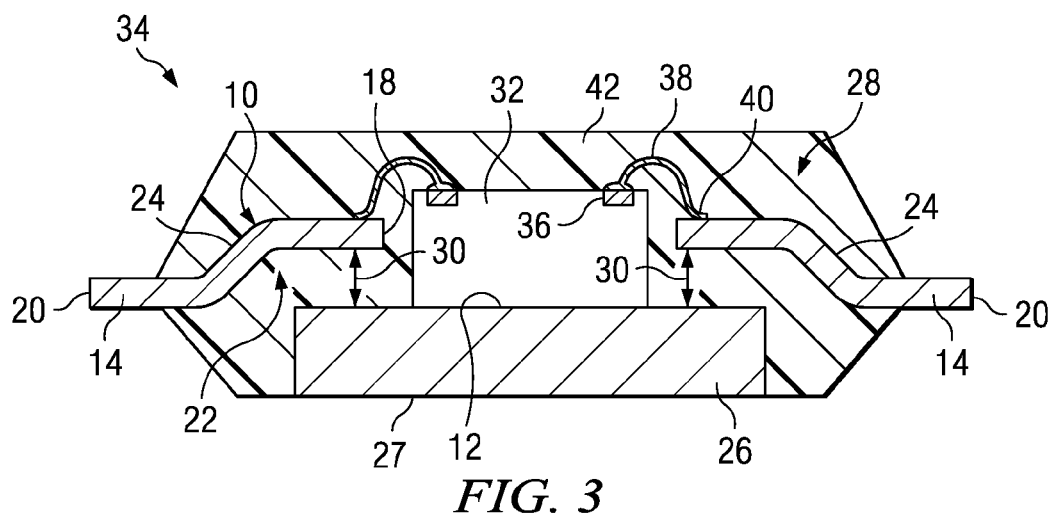
FIG. 3 is a cutaway side view of an example of a preferred embodiment of a semiconductor chip package assembly according to the invention.

Depicted in FIG. 3, a cutaway side view of an example of a preferred embodiment of a semiconductor chip package assembly 34 illustrates aspects of the invention. The metallic leadframe assembly 28 preferably includes a mounting surface 12 capable of receiving a semiconductor chip 32, in this case the central region of a the surface of a heat spreader 26 is used. The semiconductor chip 32 preferably has numerous bond pads 36 on its exposed surface for connecting bondwires 38 to the offset portions 22 of the proximal ends 18 of the leadfingers 14. In order that the bondwires 38 do not impede the leadfingers 14 from springing back, the bondwires 38 are preferably thin relative to the leadfingers 14, e.g., a 1 mil diameter wire is preferred with a 5 mil thick leadfinger, for example. Providing an additional advantage of the invention, the gap 16 between the distal end 18 of the leadfinger 14 and the chip 32 may in some cases be reduced, so that the length of the bondwires 38 may in turn be minimized in order to improve electrical performance. The heat spreader 26, as shown in the drawing, provides a thermal path from the "bottom" (as oriented in the drawings) of the chip 32 to the heat spreader surface 27 at the exterior of the package assembly 34. It can be seen in this example of a package assembly 34 according to a preferred embodiment of the invention that the offset 22 of the proximal ends 18 of the leadfingers 14 provides clearance 30 between the heat spreader 26 and the leadfingers 14. The offsetting portion 24 of the leadfingers 14 facilitates not only creating clearance 30 between the proximal ends 18 of the leadfingers 14 and the heat spreader 26, but also increases the leadfingers' 14 mechanical resistance to deflection by the application of force by wirebonding tools used for forming a bond 40 on the offset portion 22, and increases stiffness and resilience, or "spring-back", of the offset portion 22 subsequent to deflection. It is believed that the offset 22 increases the mechanical stiffness of the leadfinger 14 by effectively shortening it's length relative to the downward force applied by the wirebonding tool. It is also believed that the increased clearance 30 provided by the offset portion 22, in combination with the increased stiffness of the leadfinger 14, increase the spring-back capability of the leadfinger 14; Spring force is equal to the product of the stiffness and the clearance (30) distance.

It should be appreciated that the invention enables the use of a thicker heat spreader 26 for a given package assembly 34 thickness, and/or a thinner package 34 for a given heat spreader 26 thickness. Additionally, the enhancements of the invention enable the use of longer leadfingers 14, which makes possible a reduction of the gap 16 between the chip 32 and the proximal ends 18 of the leadfingers 14. This, in some applications, may in turn enable the use of shorter bondwires 38, improving electrical performance. The package assembly 34 is preferably encapsulated with curable dielectric mold compound 42 such as plastic or epoxy resin as known in the arts. Although variations are possible, the encapsulant 42 typically engulfs the chip 32, bondwires 38, most of the leadframe 10, and the sides of the heat spreader 26, preferably leaving exposed only the distal ends 20 of the leadfingers 14, and "bottom" (in FIG. 3) surface 27 of the heat spreader 26. The invention is believed to exhibit additional unexpected advantages in terms of providing package assemblies with improved rigidity, strength, and durability due to the mold-locking characteristics of the leadfinger offsets.

Figure 4A:
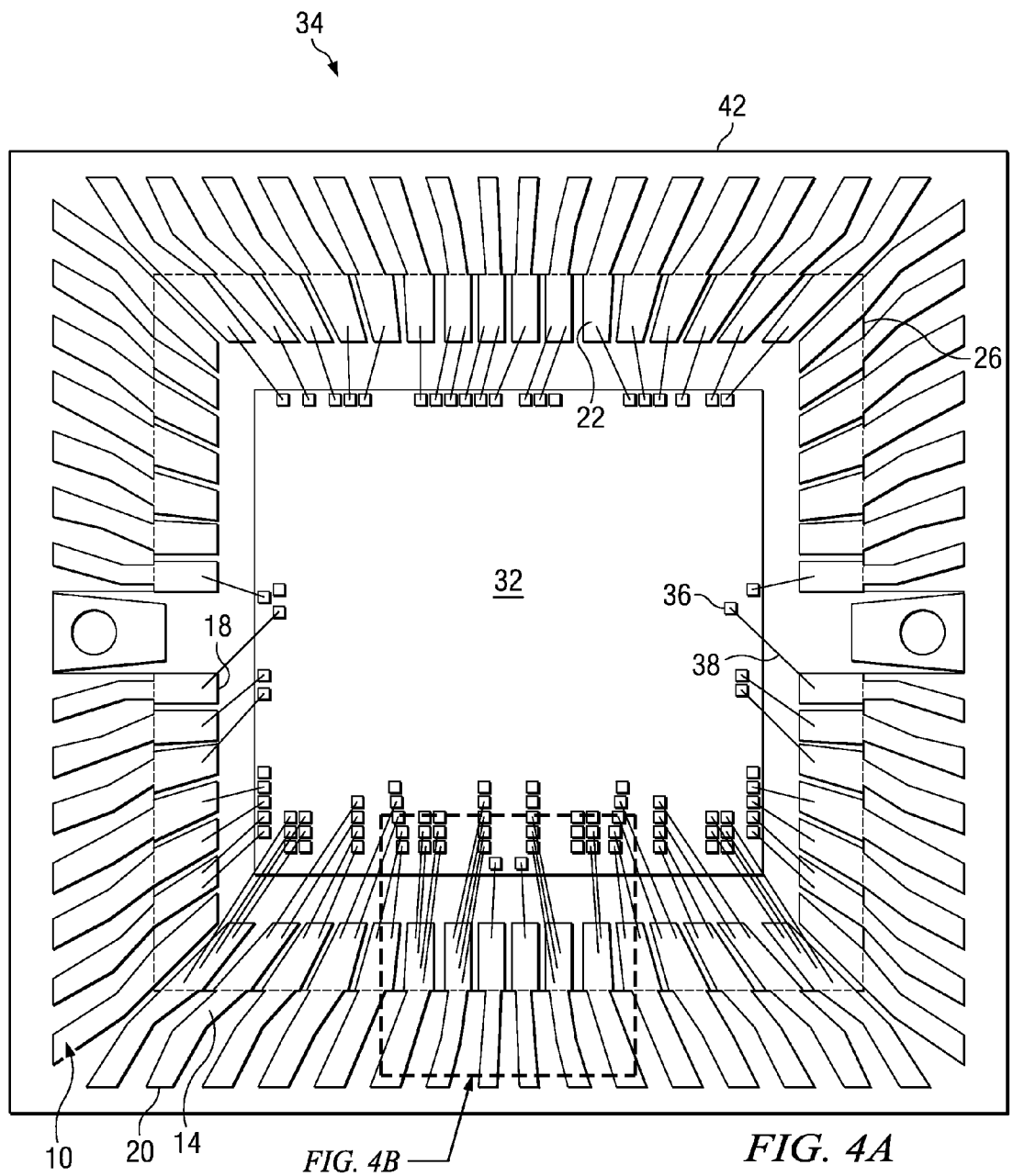
FIG. 4A is top view of an example of a preferred embodiment of a semiconductor chip package assembly according to the invention.
Figure 4B:
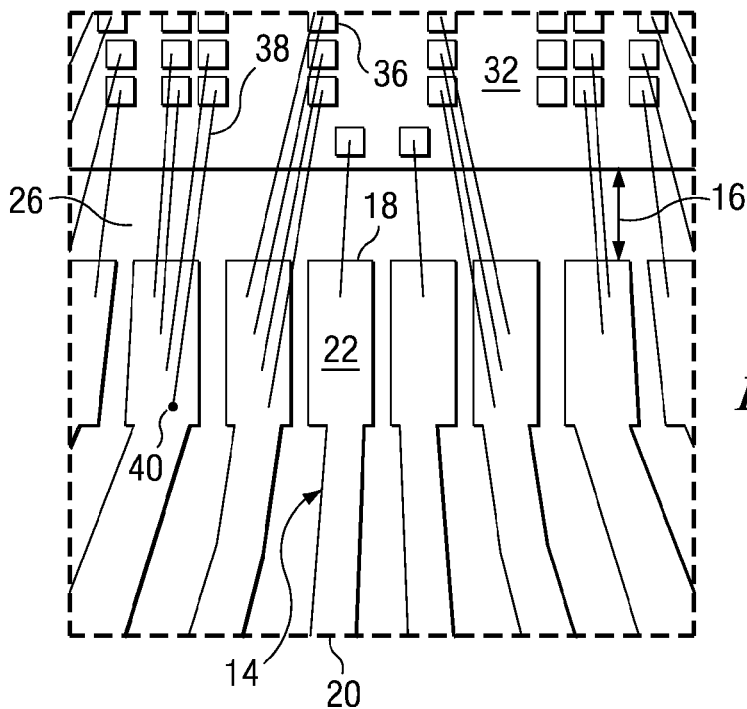
FIG. 4B is partial top view of a portion of the example of a preferred embodiment of a semiconductor chip package assembly shown in FIG. 4A.

As shown in the top view of FIGS. 4A and 4B, the invention is advantageous in that bondwires, e.g. 38, may be wirebonded from the bond pads 36 on the chip 32 to the to offset portions 22 at the proximal ends 18 of the leadfingers 14. Multiple bondwires 38, for example, sets of two, three, and four bondwires 38 are shown in FIGS. 4A and 4B, may be bonded to a single leadfinger proximal end 18, without exceeding the capability of the leadfinger 14 to spring back into an acceptable position relative to the surface of the heat spreader 26. The leadfingers 14 are preferably configured to optimize the gap 16 between their proximal ends 18 and the chip 32, preferably reducing the required lengths of the bondwires 38.

Figure 5:
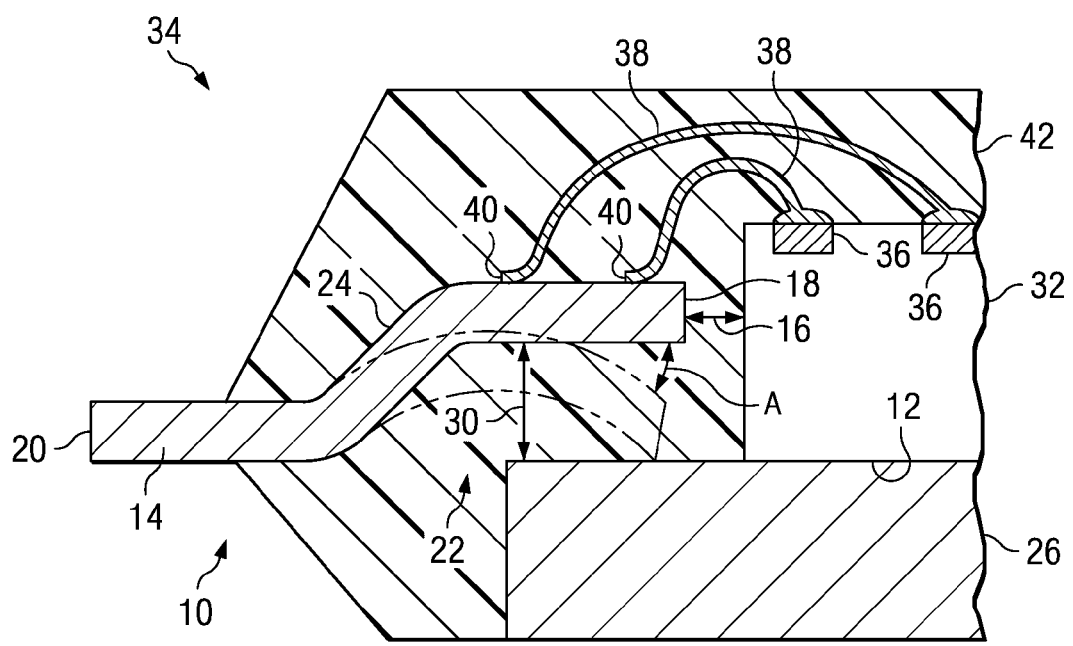
FIG. 5 is a cutaway partial side view of an example of a preferred embodiment of a semiconductor chip package assembly and method according to the invention.

FIG. 5 is an alternative cutaway side view representing an example of a preferred embodiment of a semiconductor chip package 34 and conceptual view of steps in a preferred package assembly method according to the invention. In practicing the methods of the invention, a metallic leadframe 10 is provided with a chip mounting surface 12, such as in this example, a portion of the surface of a heat spreader 24, for receiving a semiconductor chip 32 affixed thereto. The leadframe 10 also has a number of leadfingers 14, each with a proximal end 18 for receiving one or more bondwires 38, and a distal end 20 for making electrical connections external to the package 34. At least some of the leadfingers 14 are endowed with an offset portion 22 at the proximal end 18, the offset being in the direction opposite the plane of the heat spreader 26 in order to provide clearance 30 between the leadfinger 14 and heat spreader 26 opposite. The assembly 34 is encased with curable encapsulant 42 in a manner known in the arts for encapsulating the chip 32, bondwires 38, portions of the heat spreader 26, and portions 22 of the leadfingers 14. As indicated at arrow "A", the proximal end 18 of the leadfinger 14 may be deflected toward the heat spreader 26, in some cases even making contact, during the formation of a wirebond 40. The offsetting portion 24 of the leadfinger 14 provides sufficient stiffness whereby the offset 22 at the proximal end 18 of the leadfinger 14 is capable of springing back to, or nearly to, its original position subsequent to one or more wirebonding events. The clearance 30 required by the application between the leadfinger 14 and the heat spreader 26 can thus be maintained prior to the encapsulation 42 of the package 34.

The methods and package assemblies of the invention provide internal leadfinger offsets on the proximal ends of leadfingers, endowing leadframes and package assemblies with one or more useful advantages including but not limited to surprisingly improved mold locking properties, increased rigidity, reduced thickness, improved thermal performance, increased durability, and reduced costs. While the invention has been described with reference to certain illustrative embodiments and particular advantages, those described herein are not intended to be construed in a limiting sense. For example, variations or combinations of steps or materials in the embodiments shown and described may be used in particular cases without departure from the invention. Various modifications and combinations of the illustrative embodiments as well as other advantages and embodiments of the invention will be apparent to persons skilled in the arts upon reference to the drawings, description, and claims.

We claim:

1. A semiconductor chip package assembly comprising:
    a metallic leadframe comprising a plurality of leadfingers;
    a heat spreader for providing a thermal path from a mounting surface;
    each leadfinger having a proximal end for receiving one or more wirebonds and a distal end for receiving electrical connections external to the package;
    a semiconductor chip affixed to the mounting surface and having a plurality of bond pads on a surface;
    a plurality of bondwires operably coupling bond pads of the semiconductor chip to the proximal ends of individual leadfingers;
    encapsulant encapsulating the chip, bondwires, the heat spreader, and a portion of each leadfinger; and
    the encapsulated portion of each leadfinger having a first portion parallel to the mounting surface and extending beyond the encapsulant, a second portion bending from the first portion away from the mounting surface; and a third portion bending from the second portion towards the mounting surface and bonded to the bondwires.

2. The semiconductor chip package assembly according to claim 1 wherein the mounting surface comprises a portion the heat spreader.

3. The semiconductor chip package assembly according to claim 1 wherein the mounting surface further comprises a paddle portion of the leadframe.

4. The semiconductor chip package assembly according to claim 1 further comprising rivets securing the heat spreader to the leadframe.

5. A semiconductor chip package assembly comprising:
    a leadframe with a plurality of the leadfingers each having a proximal end and a distal end;
    the proximal end of each leadfinger extending over an edge of a heat spreader and the distal ends forming a first plane within an encapsulant material;
    a semiconductor chip, having a plurality of bond pads, affixed to a mounting surface of the heat spreader;
    a plurality of bondwires, each bridging a gap between an edge of the semiconductor chip and the proximal end of a leadfringer, connecting a bond pad to the proximal end of the leadfinger; and
    each of the plurality of leadfingers having an portion at the proximal end offsetting from the first plane in a direction opposite the mounting surface.

6. The semiconductor chip package assembly of claim 5, in which the plane of the first plane is parallel to the mounting surface.

7. The semiconductor chip package assembly of claim 5, in which the heat spreader is riveted to the leadframe.

8. The semiconductor chip package assembly of claim 5, in which the mounting surface is between the first plane and the proximal ends.

* * * * *